US012144156B2

(12) United States Patent
Pal et al.

(10) Patent No.: US 12,144,156 B2
(45) Date of Patent: Nov. 12, 2024

(54) COOLING FOR POWER DISTRIBUTION SYSTEMS

(71) Applicant: Hamilton Sundstrand Corporation, Charlotte, NC (US)

(72) Inventors: Debabrata Pal, Hoffman Estates, IL (US); Eric A. Carter, Monroe, WI (US); Scott R. Bouras, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 193 days.

(21) Appl. No.: 17/744,668

(22) Filed: May 14, 2022

(65) Prior Publication Data
US 2023/0371216 A1    Nov. 16, 2023

(51) Int. Cl.
*H05K 7/20*   (2006.01)
*H05K 5/06*   (2006.01)

(52) U.S. Cl.
CPC ............... *H05K 7/209* (2013.01); *H05K 5/06* (2013.01); *H05K 7/20409* (2013.01)

(58) Field of Classification Search
CPC ...... H05K 7/209; H05K 5/06; H05K 7/20409; G06F 1/20; H02M 1/44
See application file for complete search history.

(56) References Cited

U.S. PATENT DOCUMENTS

| | | | | |
|---|---|---|---|---|
| 5,440,450 A | * | 8/1995 | Lau | G06F 1/20 361/695 |
| 7,019,967 B2 | * | 3/2006 | DiFonzo | G06F 1/1662 174/544 |
| 9,137,925 B2 | | 9/2015 | Pal et al. | |
| 9,153,946 B2 | | 10/2015 | Pal | |
| 9,991,655 B2 | | 6/2018 | Pal | |
| 10,150,433 B2 | | 12/2018 | Pal | |
| 10,779,444 B2 | | 9/2020 | Neuman | |
| 10,971,873 B2 | | 4/2021 | Rai et al. | |
| 11,158,477 B2 | | 10/2021 | Mazur et al. | |
| 11,158,998 B1 | | 10/2021 | Fonseca et al. | |
| 2004/0223304 A1 | | 11/2004 | Kobayashi et al. | |
| 2006/0027390 A1 | | 2/2006 | Suzuki et al. | |
| 2012/0026668 A1 | * | 2/2012 | Landon | G06F 1/187 361/679.31 |
| 2012/0106070 A1 | * | 5/2012 | Landon | G06F 1/183 361/679.54 |

(Continued)

OTHER PUBLICATIONS

Extended European Search Report issued by of the European Patent Office, dated Oct. 4, 2023, in corresponding European Patent Application No. 23173480.7.

*Primary Examiner* — Stephen S Sul
*Assistant Examiner* — Jeffrey Francis Stoll

(57) ABSTRACT

In accordance with at least one aspect of this disclosure, a power distribution system having integrated cooling includes a chassis defining an interior cavity, an electronics bus structure housed within the interior cavity, and an electrical contactor operatively connected to the electronics bus structure to receive a voltage therefrom. One or more heat dissipation fins can be included extending away from the chassis and configured to dissipate heat from the electronics bus structure to an ambient environment external to the chassis. In embodiments, the electronics bus structure can be sealed within the interior cavity.

18 Claims, 5 Drawing Sheets

(56) References Cited

U.S. PATENT DOCUMENTS

| | | |
|---|---|---|
| 2014/0002995 A1* | 1/2014 | Pal .......................... H01H 1/62 |
| | | 361/712 |
| 2015/0289413 A1* | 10/2015 | Rush ...................... B22F 10/20 |
| | | 165/53 |
| 2015/0334869 A1* | 11/2015 | Lee ....................... H05K 7/205 |
| | | 361/709 |
| 2016/0028216 A1* | 1/2016 | Pal ........................ H01H 85/47 |
| | | 361/676 |
| 2017/0076877 A1* | 3/2017 | Pal .......................... H01H 1/62 |
| 2017/0092562 A1 | 3/2017 | Kato |
| 2017/0187300 A1* | 6/2017 | Shimazu ............... H02M 7/003 |
| 2018/0027646 A1 | 1/2018 | Sumida |
| 2018/0366922 A1* | 12/2018 | Pal .......................... H01H 9/52 |
| 2019/0214799 A1* | 7/2019 | Pal ........................ H01H 50/12 |
| 2020/0395739 A1 | 12/2020 | Santore et al. |
| 2021/0259130 A1 | 8/2021 | Jung |
| 2022/0061185 A1 | 2/2022 | Ishiyama |

* cited by examiner

COOLING FOR POWER DISTRIBUTION SYSTEMS

TECHNICAL FIELD

The present disclosure relates to cooling, and more particularly to cooling for power distribution systems.

BACKGROUND

Power distribution systems are often placed in harsh environments, such as an unpressurized and/or an uncontrolled temperature environment. Direct natural convection cooling (e.g., through vents in an electronics enclosure) may not be possible in such harsh environments. Indirect natural convection cooling (e.g., within a sealed enclosure) may not be as effective because heat from heat generating components within the system (e.g., contactors) transfer the heat to the enclosure itself. In certain variable temperature environments, such as in close proximity to a main engine start load, considerable heat must be removed from the enclosure in order to keep the electronics within an acceptable operating temperature range.

Therefore, there remains a need in the art (e.g., in the aerospace industry) for improved cooling for power distribution systems in harsh environments. This disclosure provides a solution for this need.

SUMMARY

In accordance with at least one aspect of this disclosure, a power distribution system having integrated cooling includes a chassis defining an interior cavity, an electronics bus structure housed within the interior cavity, and an electrical contactor operatively connected to the electronics bus structure to receive a voltage therefrom. One or more heat dissipation fins can be included extending away from the chassis and configured to dissipate heat from the electronics bus structure to an ambient environment external to the chassis. In embodiments, the electronics bus structure can be sealed within the interior cavity.

One or more posts can be connected to the contactor to electrically connect the contactor to the electronics bus structure. In embodiments, the one or more posts include one or more post heat dissipation fins disposed thereon. In certain embodiments, the one or more post heat dissipation fins can extend away from a respective post (e.g., horizontally) and/or the chassis (e.g., vertically). In certain such embodiments, the one or more post heat dissipation fins can be configured to dissipate heat from the one or more posts to the interior cavity and/or the ambient environment external to the chassis. In embodiments, the one or more post heat dissipation fins are formed integral with a respective post.

In embodiments, the one or more heat dissipation fins can be formed integral with the electronics bus structure. In certain embodiments, the one or more heat dissipation fins can extend in a direction opposite, or away from the contactor. In certain embodiments, the one or more heat dissipation fins can be configured to extend from the electronics bus structure through one or more apertures in the chassis. In certain such embodiments, the one or more heat dissipation fins can be configured to be in direct thermal communication with both the electronics bus structure and the ambient environment external to the chassis.

In certain embodiments, the one or more heat dissipation fins can be formed integral with the chassis. In certain such embodiments, the one or more heat dissipation fins can be configured to be in indirect thermal communication with the electronics bus structure and in direct thermal communication with the ambient environment external to the chassis.

In embodiments, the electronics bus structure can include a laminated bus structure. In certain embodiments, the one or more heat dissipation fins can be formed integral with a ground layer of the laminated bus structure. In certain embodiments, a sealing member can be included configured to seal the ground layer and the one or more heat dissipation fins within the aperture.

In accordance with at least one aspect of this disclosure, a cooling system for a power distribution system can include a sealed chassis defining an interior cavity configured to house an electronics bus structure within the interior cavity and one or more heat dissipation fins configured to be in thermal communication with the electronics bus structure to dissipate heat from the electronics bus structure and the interior cavity of the chassis to an ambient environment external to the interior cavity of the chassis.

In embodiments, the chassis can be configured to seal the electronics bus structure within the interior cavity of the chassis to shield the electronics bus structure from the ambient environment external to the interior cavity of the chassis.

In certain embodiments, the one or more heat dissipation fins can be formed integral with the electronics bus structure. In certain embodiments, the one or more heat dissipation fins can be configured to extend through one or more apertures in the chassis. In certain embodiments, the one or more heat dissipation fins can be formed integral with the chassis. In certain embodiments, the one or more heat dissipation fins can be configured to contact at least a portion of the electronics bus structure. In certain embodiments, the one or more fins can be operatively connected to an exterior of the chassis such that the one or more fins are configured to be in thermal communication with the electronics bus structure though the chassis.

In accordance with at least one aspect of this disclosure, a method can include sealing a bus structure within a chassis and transferring heat from the bus structure within the chassis to an ambient environment external to the chassis using one or more heat dissipation fins. In embodiments, sealing can include sealing the bus structure within the chassis shield the bus structure from fluid ingress. In embodiments, transferring heat can include transferring heat directly from the bus structure to the ambient environment.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
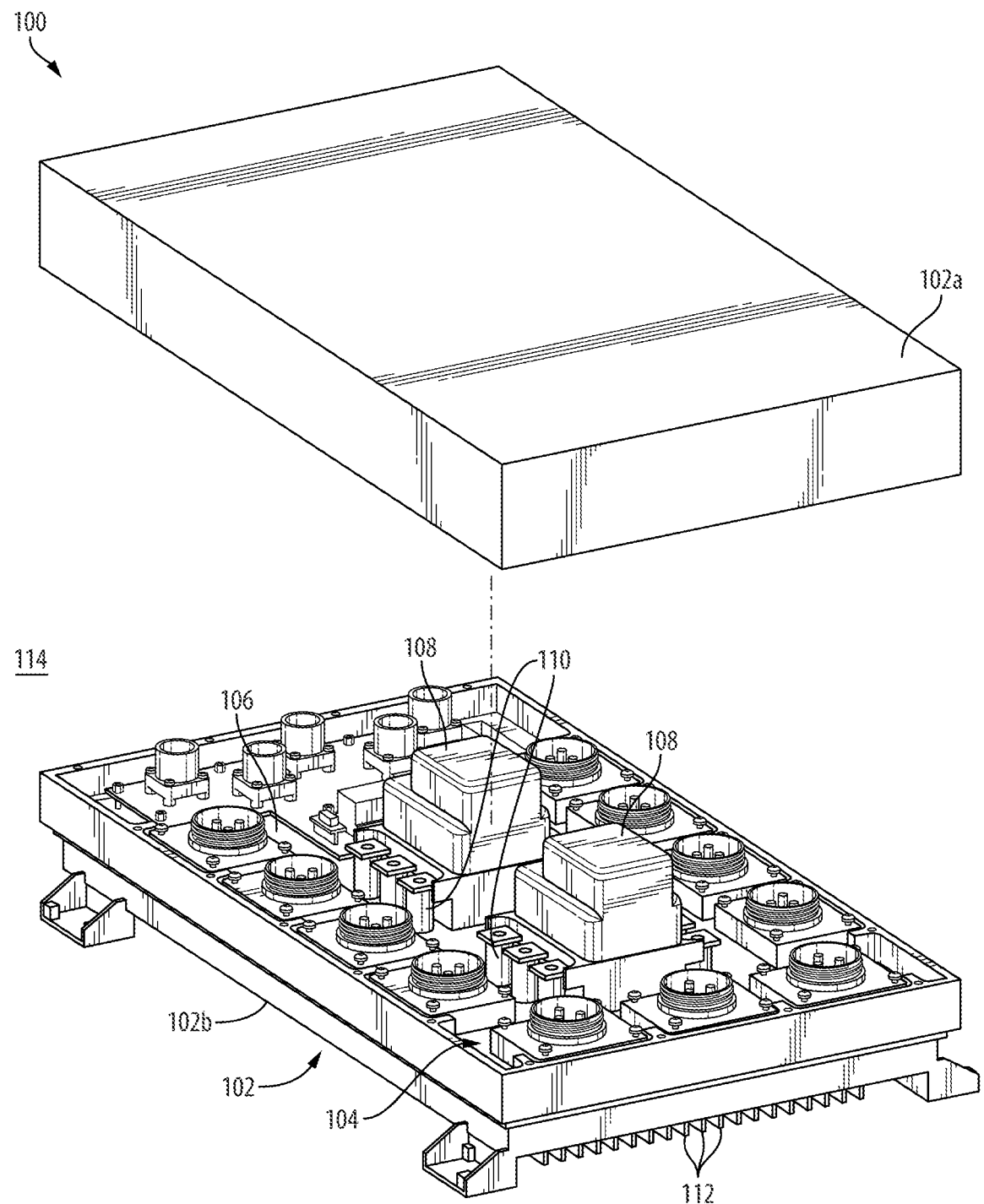
FIG. 1 is an exploded perspective view of an embodiment of a power distribution system in accordance with this disclosure, showing electronics bus structure and a chassis having an embodiment of an integrated cooling system.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2-6.

Figure 2:
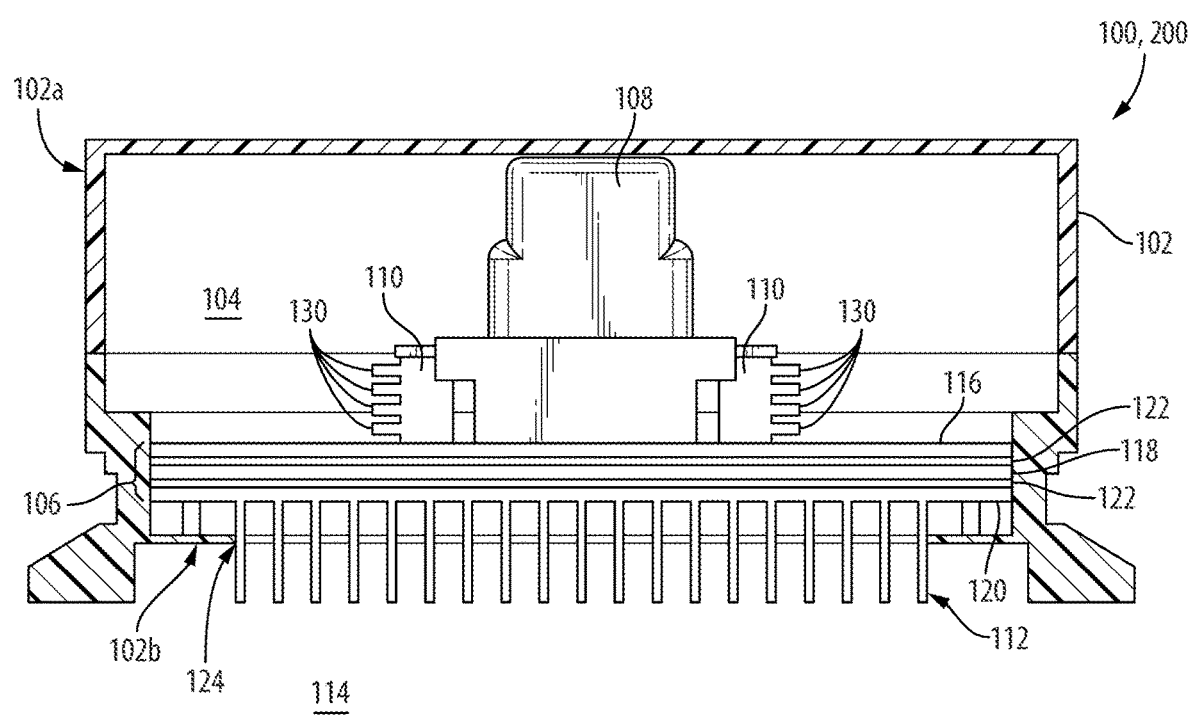
FIG. 2 is a schematic front elevation view of the power distribution system of FIG. 1, showing the cooling system.
Figure 3:
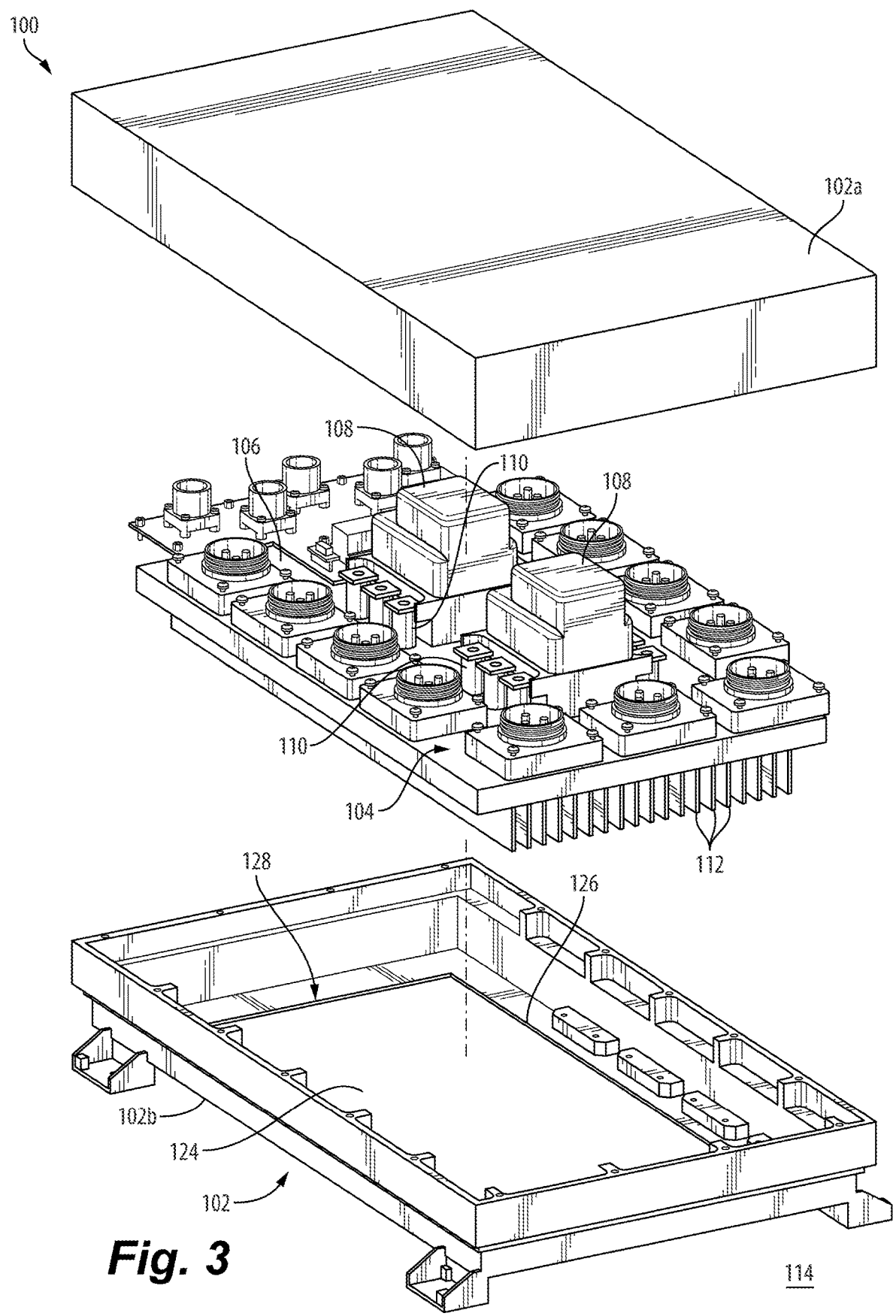
FIG. 3 is a top perspective view of a portion of the chassis of FIG. 1, showing an aperture in a lower portion of the chassis.

In accordance with at least one aspect of this disclosure, as shown in FIGS. 1-3, a power distribution system 100 can have features that allow for integrated cooling of the power distribution system 100. The power distribution system 100 can include a chassis 102 defining an interior cavity 104. The interior cavity 104 of the chassis can be defined by an upper portion 102a and a lower portion 102b of the chassis 102 coming together to form a sealed enclosure, for example as shown in FIG. 1. An electronics bus structure 106 (e.g., a bus plane or bus bar) can be housed within the interior cavity 104. The electronics bus structure 106 can include one or more electrical components configured to power and service the power distribution system 100. One such electrical component can include an electrical contactor 108. The electrical contactor 108 can be operatively connected to the electronics bus structure 106 to receive a voltage therefrom. One or more posts 110 can be included to electrically connect the contactor 108 to the electronics bus structure 106 to receive the voltage, for example as shown in FIGS. 1 and 2.

To achieve the integrated cooling, one or more heat dissipation fins 112 can be included extending away from the chassis 102. In embodiments, extending away from the chassis 102 can include extending in a vertical direction away from the lower portion 102b of the chassis 102, in a direction opposite and away from the electrical contactor 108. The one or more heat dissipation fins 112 can be configured to dissipate heat from the electronics bus structure 106 to an ambient environment 114 external to the chassis 102.

In embodiments, the electronics bus structure 106 can include a laminated bus structure, e.g., as shown. The laminated bus structure can include a plurality of layers, for example a positive layer 116, a negative layer 118, and a ground layer 120, separated from one another by insulation layers 122. While a positive layer 116 is shown as the top most layer of the bus structure 106, it is contemplated that the negative layer 118 can be the top most layer. It is also contemplated that additional layers beyond those shown may be included if needed or desired.

The one or more posts 110 can be disposed on or within the laminated bus structure to connect the contactor 108 to the positive 116 and negative layers 118 of the laminated bus structure 106. In doing so, when current passes to and from the contactor 108, through the posts 110, and through the positive and negative layers 116, 118, the laminated bus structure 106 will generate heat. Because the laminated bus structure 106 is sealed within the chassis 102, there is limited amount of heat transfer from the bus structure 106 to the ambient environment 114 via natural convection. To remedy this, in certain embodiments, the one or more heat dissipation fins 112 can be formed integral with the laminated bus structure 106, for example integral with the ground layer 120 of the laminated bus structure 106, and can extend from the electronics bus structure 106 through one or more apertures 124 in the chassis 102. For example, as shown in FIG. 3, the one or more apertures 124 can include a single window cut out of the lower portion 102b of the chassis 102 as shown. Other configurations of the aperture 124 are contemplated herein, for example a respective aperture 124 for each fin 112. This allows the one or more heat dissipation fins 112 to be in direct thermal communication with both the electronics bus structure 106 and the ambient environment 114 external to the interior cavity 104 of the chassis 102. This provides a heat transfer path from the sealed interior cavity 104 of the chassis 102 to the external ambient airflow 114.

In certain embodiments, in order to maintain the sealed nature of the chassis, a sealing member 126 can be included, for example on the lower portion 102b of the chassis 102, configured to seal the ground layer 120 and the one or more heat dissipation fins 112 within the aperture 124. The sealing member 126 can include any suitable sealing member, such as a face seal, a gasket, or an o-ring, configured to surround a perimeter 128 of the aperture 124. In certain embodiments, the sealing member can include potting material configured to fill gaps around the aperture 124 or fill in any holes formed for fastening the upper 102a and lower portions 102b of the chassis 102.

Still with reference to FIGS. 1-3, in accordance with at least one aspect of this disclosure, a method, e.g., for cooling a power distribution system 100, can include sealing a bus structure (e.g., bus 106) within a chassis (e.g., chassis 102) and transferring heat from the bus structure within the chassis to an ambient environment external to the chassis using one or more heat dissipation fins (e.g., fins 112). In embodiments, sealing can include sealing the bus structure within the chassis to shield the bus structure from the external environment and transferring heat can include transferring heat directly from the bus structure to the ambient environment.

With continued reference to FIGS. 1-3, in accordance with at least one aspect of this disclosure, a cooling system 200, e.g., for a power distribution system 100, can include a sealed chassis (e.g., chassis 102) defining an interior cavity configured to house an electronics bus structure (e.g., bus 106) within the interior cavity and one or more heat dissipation fins (e.g., fins 112) configured to be in thermal communication with the electronics bus structure to dissipate heat from the electronics bus structure and the interior cavity of the chassis to an ambient environment external to the interior cavity of the chassis. In embodiments, the chassis can be configured to pressure seal the electronics bus structure within the interior cavity of the chassis, for example to shield the electronics bus structure from pressure changes when the power distribution system 100 is included in an unpressurized environment. In certain embodiments, the chassis can be configured to seal the electronics bus structure from the external environment, for example to prevent moisture or fluid ingress. In embodiments, one or more draining provisions may be included in the event any fluid or moisture does pass through the sealing member(s).

Figure 4:
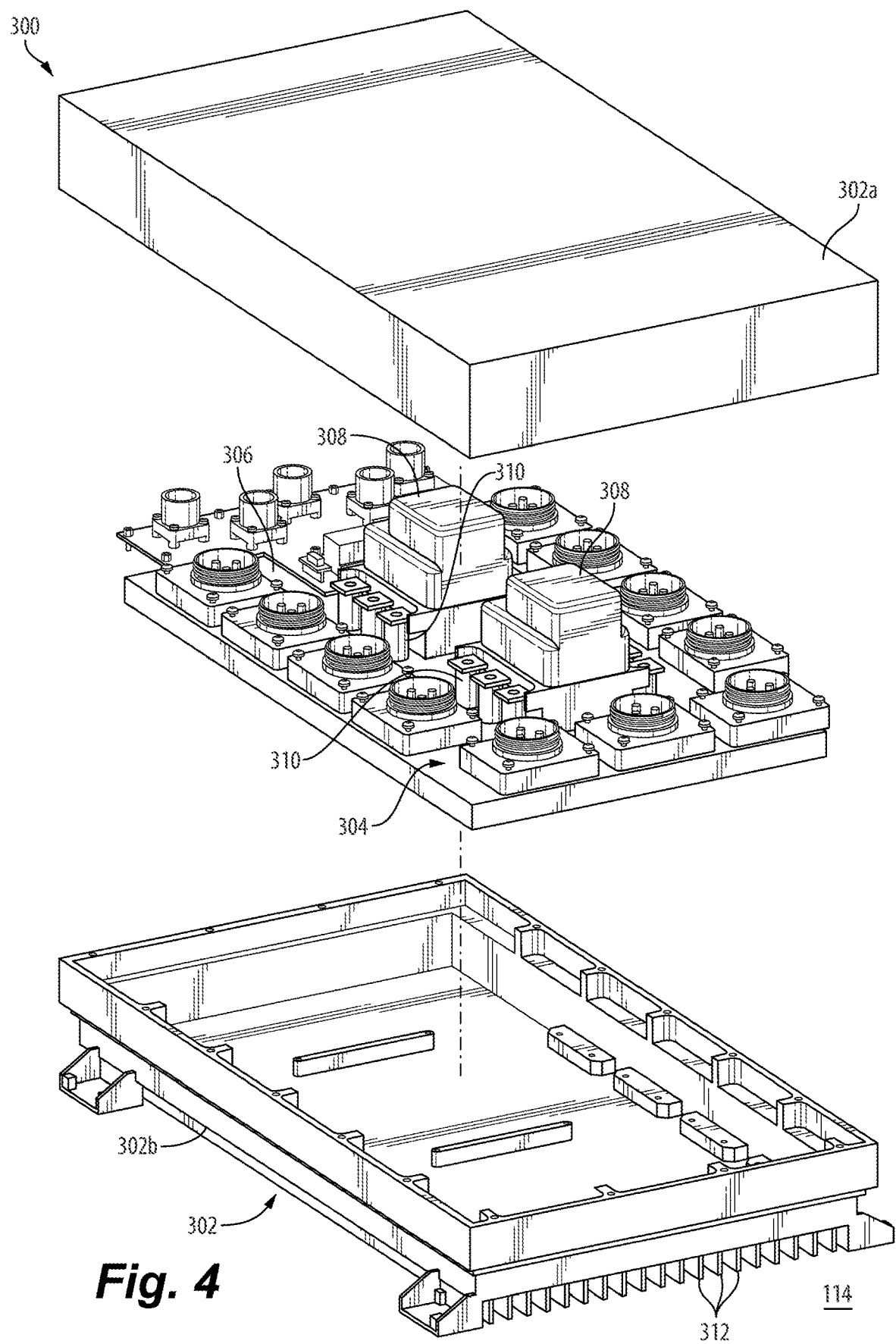
FIG. 4 is a top perspective view of another embodiment of a power distribution system in accordance with this disclosure, showing a lower portion of a chassis having another embodiment of an integrated cooling system.
Figure 5:
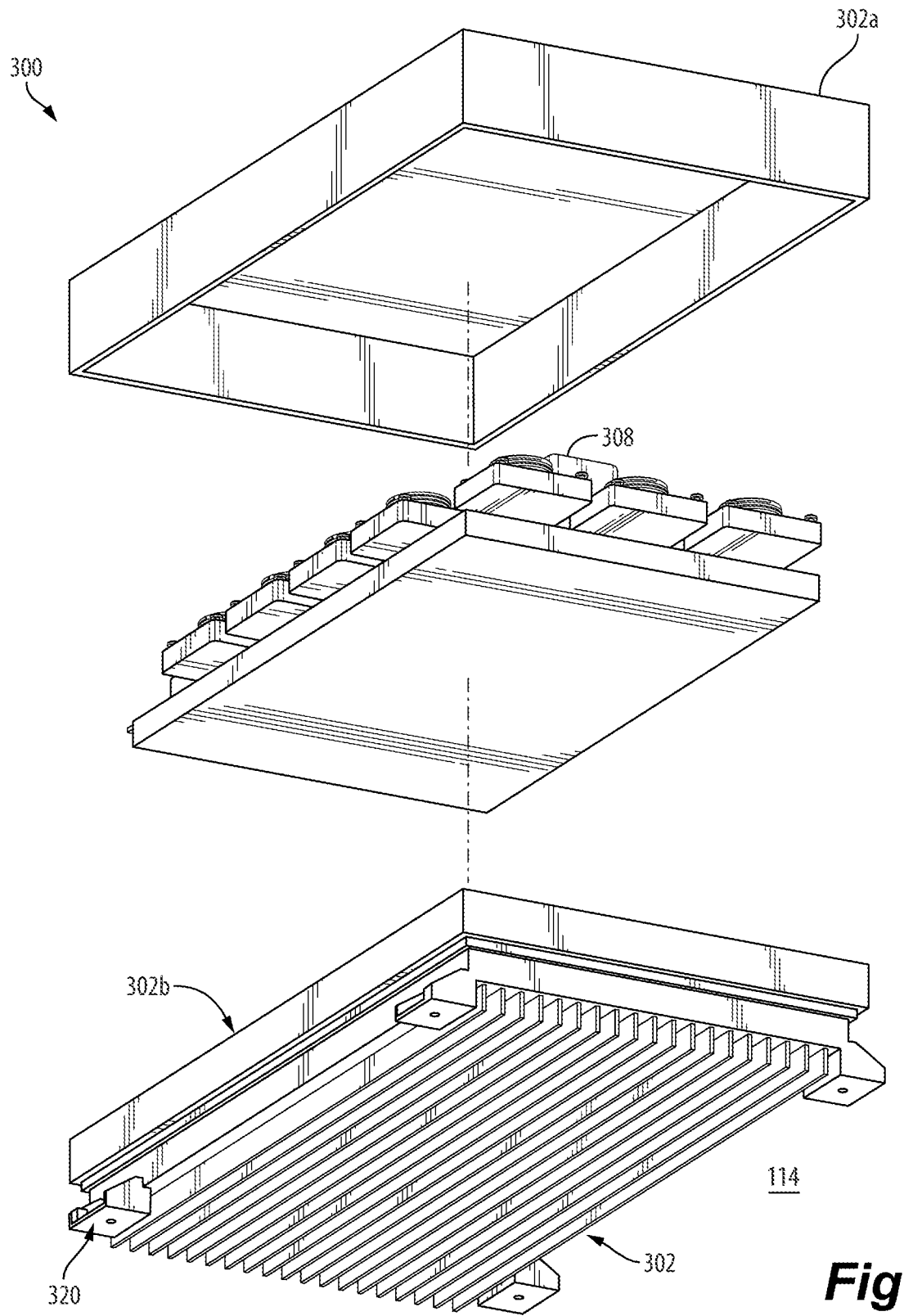
FIG. 5 is bottom perspective view of the lower portion of the chassis of FIG. 4.

In accordance with at least one aspect of this disclosure, another embodiment of the power distribution system 100 and cooling system 200 is shown in FIGS. 4 and 5 as system 300. The system 300 can have similar components and features with respect to systems 100, 200. For brevity, the description of common elements that have been described above for systems 100, 200 are not repeated with respect to system 300 as shown in FIGS. 4 and 5.

In certain embodiments, such as seen most clearly in FIG. 5, in system 300, the one or more heat dissipation fins 312 can be formed integral with the chassis 302 (e.g., the lower portion 302b), instead of the bus structure 106. Here, the one or more heat dissipation fins 312 can be configured to contact at least a portion of the electronics bus structure 306, for example by virtue of the ground layer 320 being fastened to the lower portion 302b of the chassis 302. Alternatively, in certain embodiments, the one or more fins 312 can be operatively connected to an exterior 328 of the chassis 302 such that the one or more fins 312 are configured to be in thermal communication with the electronics bus structure 306 though the chassis 302. More specifically, in system 300 the one or more heat dissipation fins 312 can be configured to be in indirect thermal communication with the electronics bus structure 306 and in direct thermal communication with the ambient environment 114 external to the chassis 302.

In accordance with at least one aspect of this disclosure, in certain embodiments of the systems 100, 200, 300 the one or more posts 110 can include one or more post heat dissipation fins 130 disposed thereon or formed integral therewith. The one or more post heat dissipation fins 130 can be included in addition to the one or more heat dissipation fins 112 on the bus structure 106, 306 and/or the one or more heat dissipation fins 312 on the chassis 302. In certain embodiments, the one or more post heat dissipation fins 130 can extend away from a respective post 110 (e.g., horizontally) and/or away the chassis 102 (e.g., vertically). In certain embodiments, the one or more post heat dissipation fins 130 can be configured to dissipate heat from the one or more posts 110 to the interior cavity 104 and/or the ambient environment 114 external to the chassis (e.g., similar to fins 112). In certain such embodiments, voltage isolation members may be included between the post 110 and the fins 130.

Embodiments include a power distribution system, (e.g., for an aircraft). Certain, conventional, power distribution systems may be disposed in air conditioned and temperature controlled environments allowing for natural convection to cool the electronics components within the chassis. To do so, the typical chassis will include ventilation apertures, for example, to allow for airflow within and through the chassis. However, in certain instances, the power distribution system 100, 300 may be disposed in a harsh environment with high, uncontrolled temperatures and the environment may be unpressurized. Such environments may be in close proximity to an engine, a generator, and/or a gearbox for example, which require a full sealing of the chassis. Because of this, conventional natural convection cooling is not possible. Embodiments of the systems described herein, e.g., systems 100, 200, 300 include a fully sealed chassis that is suitable for such harsh environments and provides novel integrated cooling techniques to allow for such a placement.

Embodiments provide advanced thermal and packaging techniques where heat from the contactor is transferred to the power distribution box housing, and from power distribution box to ambient efficiently, e.g., through the one or more heat dissipation fins. As shown, the one or more heat dissipation fins can stick through or extend through the back (e.g., the lower portion) of the chassis and directly into the external air. In this manner thermal contact resistance from bus structure to the chassis can be eliminated. In addition, heat dissipation fins on the contactor post provides additional heat removal, and even more so when the post fins also extend directly into the external air. In certain cases, additional external fins for additional heat transfer from the power distribution box to external ambient can be included on the chassis itself. Thermal analysis has been conducted for certain embodiments, wherein a given bus structure and relays were powered for set amount of time at an overload, following a continuous powering at a normal load, in ambient conditions that simulated a hot day (e.g., at least 50 degrees C. or greater) while the aircraft was on the ground. In this case, the thermal analysis showed the heat dissipation fins of the integrated cooling systems were able to maintain an acceptable operating temperature for the bus structure, contactors, and relays during both the continuous normal load and the subsequent overload conditions.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A power distribution system having integrated cooling, comprising:
    a chassis defining an interior cavity;
    an electronics bus structure housed within the interior cavity against a bottom wall of the chassis;
    an electrical contactor operatively connected to the electronics bus structure to receive a voltage therefrom;
    one or more heat dissipation fins extending away from the chassis and configured to dissipate heat from the electronics bus structure to an ambient environment external to the chassis, wherein the one or more heat dissipation fins are configured to extend from the electronics bus structure through one or more apertures in the bottom wall of the chassis; and
    a sealing member disposed on the bottom wall of the chassis surrounding a perimeter of the one or more apertures, wherein the sealing member comprises a potting material disposed inside the one or more apertures to seal the electronics bus structure and the one or more heat dissipation fins within the one or more apertures.

2. The system of claim 1, wherein the electronics bus structure is sealed within the interior cavity.

3. The system of claim 1, further comprising one or more posts connected to the electrical contactor to electrically connect the electrical contactor to the electronics bus structure, wherein the one or more posts include one or more post heat dissipation fins disposed thereon.

4. The system of claim 3, wherein each of the one or more post heat dissipation fins extends away from a respective post of the one or more posts and the chassis, and wherein the one or more post heat dissipation fins are configured to dissipate the heat from the one or more posts to the interior cavity of the chassis.

5. The system of claim 3, wherein each of the one or more post heat dissipation fins is formed integral with a post of the one or more posts.

6. The system of claim 1, wherein the one or more heat dissipation fins are formed integral with the electronics bus structure.

7. The system of claim 6, wherein the one or more heat dissipation fins are configured to be in direct thermal communication with both the electronics bus structure and the ambient environment external to the chassis.

8. The system of claim 6, wherein the electronics bus structure includes a laminated bus structure.

9. The system of claim 8, wherein the one or more heat dissipation fins are formed integral with a ground layer of the laminated bus structure.

10. The system of claim 8, wherein the sealing member is configured to seal a ground layer within the one or more apertures.

11. A cooling system for a power distribution system, comprising:
    a sealed chassis defining an interior cavity configured to house an electronics bus structure against a bottom wall of the sealed chassis and an electrical contactor operatively connected to the electronics bus structure to receive a voltage therefrom within the interior cavity;
    one or more heat dissipation fins configured to be in thermal communication with the electronics bus structure to dissipate heat from the electronics bus structure and the interior cavity of the sealed chassis to an ambient environment external to the interior cavity of the sealed chassis, wherein the one or more heat dissipation fins are configured to extend from the electronics bus structure through one or more apertures in the bottom wall of the sealed chassis; and
    a sealing member disposed on the bottom wall of the sealed chassis surrounding a perimeter of the one or more apertures, wherein the sealing member comprises a potting material disposed inside the one or more apertures to seal the electronics bus structure and the one or more heat dissipation fins within the one or more apertures.

12. The system of claim 11, wherein the sealed chassis is configured to seal the electronics bus structure within the interior cavity of the sealed chassis to shield the electronics bus structure from the ambient environment external to the interior cavity of the sealed chassis.

13. The system of claim 11, wherein the one or more heat dissipation fins are formed integral with the electronics bus structure.

14. The system of claim 11, wherein the one or more heat dissipation fins are formed integral with the sealed chassis.

15. The system of claim 14, wherein the one or more heat dissipation fins are configured to contact at least a portion of the electronics bus structure.

16. A method, comprising,
    sealing a bus structure and an electrical contactor operatively connected to the bus structure to receive a voltage therefrom within a chassis and against a bottom wall of the chassis by using a sealing member on the bottom wall of the chassis surrounding one or more apertures in the bottom wall of the chassis, the sealing member comprising a potting material disposed inside the one or more apertures to seal the bus structure and one or more heat dissipation fins within the one or more apertures; and
    transferring heat from the bus structure within the chassis to an ambient environment external to the chassis using the one or more heat dissipation fins extending from the bus structure through the one or more apertures.

17. The method of claim 16, wherein sealing includes sealing the bus structure within the chassis to shield the bus structure from fluid ingress.

18. The method of claim 16, wherein transferring the heat includes transferring the heat directly from the bus structure to the ambient environment.

* * * * *